United States Patent [19]
Nolan et al.

[11] Patent Number: 6,142,789
[45] Date of Patent: Nov. 7, 2000

[54] DEMATEABLE, COMPLIANT, AREA ARRAY INTERCONNECT

[75] Inventors: Steven Nolan, Jim Falls; Bradley W. Bartilson, Chippewa Falls; Ronald Kunkel, Jim Falls, all of Wis.

[73] Assignee: Silicon Graphics, Inc., Mountain View, Calif.

[21] Appl. No.: 08/934,973

[22] Filed: Sep. 22, 1997

[51] Int. Cl.$^7$ ............................................ H01R 12/00
[52] U.S. Cl. .................................. 439/66; 439/67
[58] Field of Search .......................... 439/66, 67, 91, 439/591

[56] References Cited

U.S. PATENT DOCUMENTS

| | | | |
|---|---|---|---|
| 3,842,189 | 10/1974 | Southgate | 174/52.3 |
| 4,548,451 | 10/1985 | Benarr et al. | 439/66 |
| 4,950,173 | 8/1990 | Minemura et al. | 439/82 |
| 5,086,337 | 2/1992 | Noro et al. | 357/79 |
| 5,152,695 | 10/1992 | Grabbe et al. | 439/66 |
| 5,632,631 | 5/1997 | Fjelstad et al. | 439/66 |
| 5,738,531 | 4/1998 | Beaman et al. | 439/71 |
| 5,759,047 | 6/1998 | Brodsky et al. | 439/66 |

FOREIGN PATENT DOCUMENTS

| | | |
|---|---|---|
| 0614089 | 9/1994 | European Pat. Off. . |
| 01155633 | 6/1989 | Japan . |
| WO94/01984 | 1/1994 | WIPO . |

OTHER PUBLICATIONS

Chanchani, R., et al., "Mini BGA—Pad and Pitch Ease Die Test and Handling", *Reliability—Advanced Packaging*, 34–37, (May/Jun., 1995).

Herard, J.D., et al., "Interconnection Technology", *Flex Packaging,* Using Dendrites to Bridge the gaps. Printed Circuit Fabrication—vol. 18, No. 9, 22–24, (Sep. 1995).

Strange, A., et al., "Elastomerics Require Design Subtleties—Making the most of the elastomer connector's benefits means paying attention to detail.", *Electronic Design—PIPS Special Editorial Feature,* PIPS Electronic Design, 99–103, (Aug. 7, 1995).

Treece, R.K., "mBGA Technology Overview", *Distinguished Member of Technical Staff Sandia National Laboratories,* Albuquerque, New Mexico, 7 Pages.

Primary Examiner—T. C. Patel
Attorney, Agent, or Firm—Schwegman, Lundberg, Woessner & Kluth, P.A.

[57] ABSTRACT

An interconnection device has a multiplicity of individual arms attached to a carrier board. The carrier board includes vias which go through the board and have a pad on the top and bottom of the board near the via. Attached to each via pad is an arm. The arm is attached so that its free end extends out over the clearance hole in the carrier board. The free end of the arm positioned over the clearance hole includes a surface treatment which allows the free end to make good electrical contact with a mating device. Each of the arms is positioned so that it corresponds to the pads on the device to which it will connect. Each of the arms acts as a cantilevered beam. The arms are deflected. The geometry, material, material temper, and surface plating allow for a very low overall force having to be applied to the interconnection in order to provide good electrical contact between the first module and second module being interconnected. The amount of compliance may be 10 to 12 mils. Compliance will vary widely depending on pitch.

26 Claims, 8 Drawing Sheets

DEMATEABLE, COMPLIANT, AREA ARRAY INTERCONNECT

FIELD OF THE INVENTION

The present invention relates to a method and apparatus for providing electrical contacts and more specifically to making electrical contacts between pads on a first substrate and pads on a second substrate.

BACKGROUND OF THE INVENTION

High speed electronic digital computers of the type produced by Cray Research, Inc., the assignee hereof, typically require short length electrical connections between various electrical cards and chips. Shorter length electrical connections introduce fewer timing problems between signals within the high speed digital computer. Timing problems between electrical signals can result from electrical signals passing through different lengths of wire. The shorter length contacts also provide better electrical performance when compared to a longer contact. A longer contact has more inductance and capacitance when compared to a shorter contact. More importantly, different lengths of wire will produce different amounts of impedance through various lengths of wire. Differences in impedance include different capacitances and inductances. At various frequencies, the different impedances may introduce undesirable elements to the signals passing through the wires. It is desirable to have short and uniform length contact paths to lower impedance effects.

The general trend in electronic packaging has been to pack more electronics, such as transistors, onto a single substrate. Some microprocessors, for example, include 10,000 transistors in a 1.5 inch square substrate. One die on a substrate or module is called a single chip module (SCM). Placing multiple dice onto one substrate produces multi-chip modules (MCMs). Placing more electronic components onto a single substrate produces shorter length electrical connections between components, which is desirable from the standpoint of designing a computer. However, such dense electronic packaging gives rise to a host of other problems. One such other problem is that each module, whether its a MCM or SCM, has a high number of tightly spaced electrical connection points or input/output pads (I/O pads) for signals input to the module or for signals output from the module. In a computer system of any sort, various modules or substrates have to be interconnected to produce a fully functioning computer. Good, reliable electrical connections between selected I/O pads on one module or substrate and selected I/O pads on another module are required to build a dependable computer system. The electrical connections need to provide low electrical resistance to produce a reliable connection. All modules or substrates are now designed with the interconnection of the final product in mind, so that the I/O pads for one module correspond to the I/O pads for another module. As a result, an apparatus and method for making many electrical connections is needed. There is also a constant push toward smaller footprint modules with increased numbers of I/O pads. Consequently, there is also a need for an apparatus with a larger number of tightly spaced I/O pads.

Electrical connections between a module and a printed circuit board can be done in a number of ways. The attachment methods can be categorized into two methods. A module can be either hard attached or removably attached. Hard attachment means that the pins or pads of a memory chip, multiple chip module ("MCM") or single chip module ("SCM") are soldered directly to a printed circuit board ("PCB"). Removable attachment means there is some form of interconnection that allows two attached components to be separated. Both the hard attached modules and the removably attached modules have problems. Hard attachment has a disadvantage in that the electrical component module may have a different coefficient of thermal expansion ("CTE") than the printed circuit board to which it attaches. The coefficient of thermal expansion for silicon is lower than the coefficient of thermal expansion for a ceramic substrate, which is lower than the CTE of the PCB. When the printed circuit board is heated, the ceramic or silicon substrate does not expand as much as the printed circuit board. The pins located at the outside corners usually are stressed and fatigued the most and therefore fail first.

Demateable coupling of a ceramic or silicon electrical component and printed circuit board typically is not plagued with connection failures due to different coefficients of thermal expansion between the electrical components and the printed circuit board to which they are attached. However, demateable couplings typically have other problems. One of the larger problems with demateable couplings is compliancy. Lack of compliancy is a problem when an individual electrical component is coupled with another individual electrical component or with a printed circuit board. The interconnect must be compliant or allow for some different heights between the interconnection sites in order to be successfully attached. Lack of compliancy is also a problem when there are multiple electrical components to be attached to a single printed circuit board.

Making a direct electrical contact between a high number of non-compliant I/O pads on an individual electrical component and a high number of non-compliant I/O pads on another substrate or printed circuit board is nearly impossible.

Making a connection between electrical components and a printed circuit board having connection sites for multiple components requires compliancy or an allowance for different height components if all components are to remain the same total height for proper thermal management, i.e., contact to a cold plate. In other words, for a multi-site type of attachment, the compliancy must accommodate not only differences in height within the component but also must accommodate differences in height between components.

Also, it is difficult to uniformly distribute a proper amount of force over a high number of pads so that each I/O pad will form a reliable electrical connection with a corresponding I/O pad due to planarity. In addition, if the modules are brought together for the purposes of testing, all the electrical connections at each I/O pad would have to be made reliably for each test and would have to be made so that no significant wear was produced on the I/O pads of the module under test.

There are many apparatus and methods that provide for a compliant interconnection between an electrical component and a printed circuit board. Two more common ways for making the interconnections include use of woven wire contacts, and use of elastomeric sheets with embedded wires. A woven wire contact is an interconnect that includes a column of woven electrically conductive material. The electrically conductive material is a woven like steel wool. The column of woven material is compressed between a contact pad on the two mated devices, such as a contact pad on a substrate and a contact pad on a PCB. The use of woven material columns provides interconnection to contacts having a fairly wide range of heights when compared to the use of an elastomeric sheet filled with wires. However, the woven columns cannot be closely spaced, although they accommodate a wide range of height. When the I/O pads are closely spaced on the electrical components, the columns of woven conductive material are not available in a small enough dimension to provide an independent contact to each I/O pad or pin from the electrical component. If an independent connection is not made to each I/O pad, or if shorting is created, the electrical component is not capable of being used.

Another method and apparatus that has been used to connect contacts between a first component and a second component is an elastomeric sheet that contains conductive wire or fibers. There are many manufactures of this type of material. One such elastomeric sheet is approximately 2 mils to 3 mils in thickness and contains small wires which provide a conductive path through the elastomeric sheet. The elastomeric sheet is merely sandwiched between the I/O pads of the electrical component and the printed circuit board to provide an interconnection. The pads of the electrical component are aligned with the pads of the printed circuit board so that the electrical connections can be made. The elastomeric sheets can accommodate a higher pitch than the woven wire contacts, however, when compared to the woven wire contact material, the compliancy or the amount of height difference that can be accommodated is lower. The sheet is only 2–3 mils thick to start with so the maximum possible compliancy will be less than 2–3 mils whereas the woven wire compliancy may be up to 6 mils.

With respect to the use of woven columns of conductive material, a structure for accommodating a pitch of 40 mils or less is not available. In addition, the force that must be applied to connect an electrical component and a printed circuit board using woven columns are relatively large. A high force will be required in order to compress the high number of individual columns of steel wool-like material. For an interconnection with 1600 contacts, it is not uncommon to place 300 pounds of force onto the components being interconnected.

Placing such a high force on such a small substrate requires a fairly substantial mechanical device for applying the high force. Using such a large mechanical device is not conducive to a compact computer design. In supercomputers, there are many such interconnections since there are many processor units that must be interconnected with other substrates and there are also many memory units that also have to be mated with other components. Placing bulky mechanical devices inside a computer frame for each of the many interconnections that is required takes up space and makes cooling difficult. In summary, woven wire contacts can accommodate non-planarity of the chips, but large forces are necessary to accomplish this task. In addition, woven wire contact products are not available for low pitch products.

Using a sheet of elastomeric material with conductive wires located within the elastomeric material also has problems. The amount of compliance or accommodation of non-planarity is low. Therefore, the substrates that are going to be interconnected using an elastomeric material must be fairly planar. In addition, high forces are needed to produce the interconnection and obtain the compliance between the two contact pads. The electrical resistance when making connections with the elastomeric sheets is typically very high. Another problem is shorting or open connections. When the density of the interconnects gets high or, saying the same thing, the pitch between the interconnects gets low, the conductive fibers or res in the elastomeric sheet may go from one contact to another undesired contact, hereby producing a short. It may be impossible with low pitch I/O to obtain pad sizes large enough to insure no opens without also causing shorting.

As mentioned above, the elastomeric sheet interconnect has low compliance. The amount of non-planarity accommodated with one elastomeric material is approximately 2 mils which means that all the electrical contact pads on both substrates have to be within a 2 mil tolerance total. Such close tolerances increase manufacturing costs or simply are not available.

Elastomeric materials may also be subject to creep at high temperatures and very high stiffness (lack of compliance) at very low temperatures.

Another problem associated with existing interconnects is that the inductance, capacitance, and resistance between the contacts of existing connectors and the I/O pads on a module or chip will not allow for a high frequency operation of 100 MHZ and beyond. Present compliant interconnect systems do not offer high frequency performance at the I/O pad pitches or spacings which will be required for future computer systems. The current techniques for producing compliant interconnects do not employ the large area processing (LAP) techniques that result in low-cost fabrication.

SUMMARY OF THE INVENTION

An apparatus for interconnecting a first component and a second component accommodates non-planarities and provides low impedance at high frequencies. In addition, a relatively small and controlled amount of force assures a good, consistent electrical connection between I/O pads of the first and second component. The advantages listed above can be reproduced for each module under test. The invention addresses the need for a fine pitch, high number I/O interconnect which meets inductance, capacitance, and resistance requirements at high frequencies operating above 100 MHZ.

The demateable compliant area array interconnect apparatus allows for an increased amount of compliance when compared to past solutions. The added compliance is accomplished with less force needing to be applied to the devices being interconnected. As a result, the total force necessary to interconnect the first and second device is low compared to other solutions. For example, each interconnection site uses about 20 grams of force or less. This is much less force per site than when compared to other interconnection systems. In an interconnection system using an elastomer, more force is needed to deform the elastomer. Woven wire contacts typically require 60 grams or more.

A carrier board includes at least one site which has an arm. A portion of the arm extends over the clearance opening and another portion is attached to an area near the clearance opening. The arm deflects into the clearance opening. Two arms can be similarly placed, one on each side of the substrate, or the other side can be hard attached, i.e., soldered, to a device. The attached portions of the arm are electrically connected by a via plated with electrically conductive material. An electrical path is then formed which includes a first arm, the via and the second arm. Many such sites may be made on a carrier board, The technique used for making the compliant interconnects according to the invention is a large area processing (LAP) technique which results in lower-cost interconnects.

DESCRIPTION OF THE PREFERRED EMBODIMENT

In the following detailed description of the preferred embodiment, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
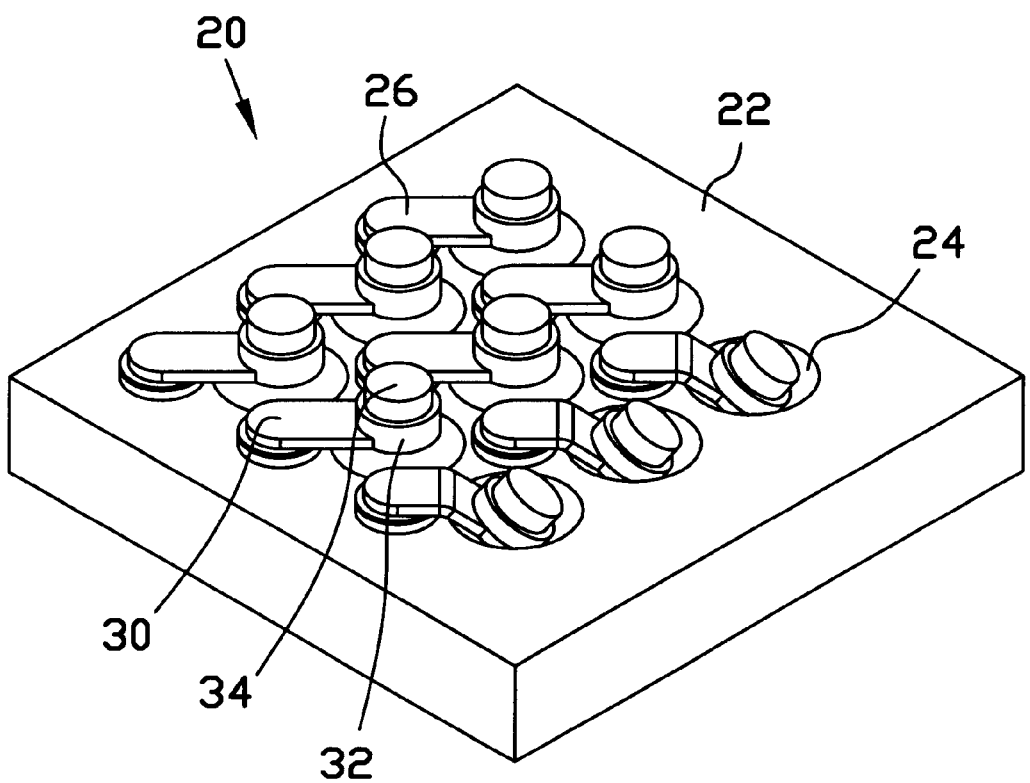
FIG. 1 is a isometric drawing of several I/O sites which show some of the I/O sites in an undeflected position and others in a deflected position.

FIG. 1 shows one side of a compliant array interconnect 20. The compliant array interconnect 20 includes a carrier board 22 which has a plurality of clearance openings 24 therein. The clearance openings 24 extend completely through the carrier board 22. It should be noted that the clearance openings 24 do not necessarily have to extend through the carrier board. The compliant area array interconnect 20 includes a plurality of interconnection sites 26. In FIG. 1 only nine interconnection sites in a three-by-three matrix are shown. It should be understood that a compliant area array interconnect 20 can include a multiplicity of interconnection sites 26. Each of the interconnection sites 26 includes an arm 30 having one end attached to the carrier board 22 at a location near a clearance opening 24. The arm 30 has a free end 32 which includes an electrical contact 34. The free end 32 of the arm is positioned over the clearance opening 24 in the carrier board 22. Another way to describe this structure is that the electrical contact 34 is positioned over the clearance opening 24 in the carrier board 22 by a cantilevered arm 30. When used, the electrical contact 34 may be pressed toward the clearance opening 24 in the carrier board 22. The arm 30 deflects and produces a spring force which acts through the electrical contact 34 positioned at the free end 32 of the arm. In FIG. 1 three of the interconnection sites 26 are shown with arms 30 deflected. The cantilevered arm 30 may be designed so that it passes only through the elastic range of the metal when accommodating non-planarity. The designs which remain in the elastic region are interconnects that are reusable. The cantilevered arm 30 can also be designed so that it passes into the plastic region or deforms when deflected. These interconnects are not reusable.

Figure 2:
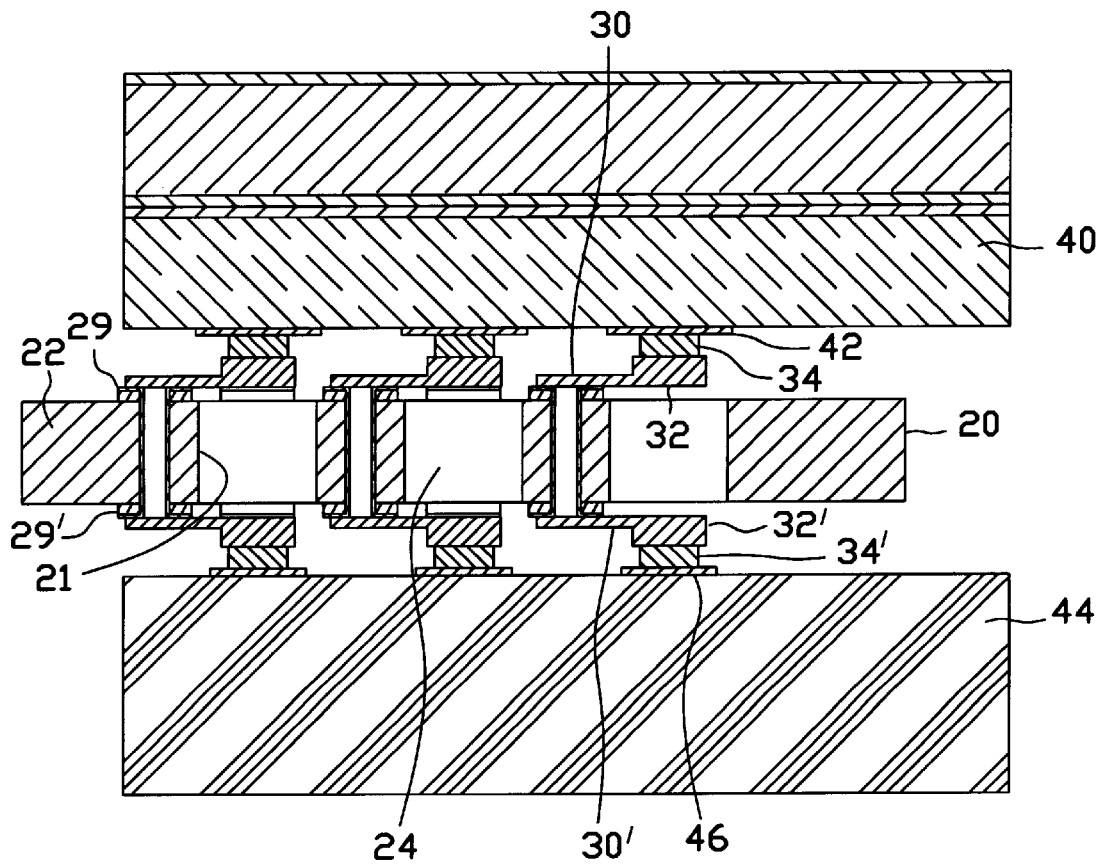
FIG. 2 is a cross section view of the compliant area array interconnect in sandwiched between two modules.

Now turning to FIG. 2, we see a cross-sectional view of the demateable, compliant area array interconnect 20 in contact with a first module 40 and a second module 44. The first module 40 has electrical contact pads 42 which correspond to the electrical contact 34 of the compliant area array interconnect 20. The second module 44 has electrical contact pads or input/output ("I/O") pads 46 which correspond to electrical contacts 34' positioned on the free end of arm 30'. As can be seen from the cross-sectional view shown in FIG. 2, the clearance openings 24 pass through the carrier board 22. FIG. 2 reveals that each of the interconnection sites 26 has a pair of arms 30 and 30', a pair of contacts, 34 and 34' and that each of the free ends 32 and 32' are positioned over the clearance opening 24. It should be noted that interconnection sites 26 may exist with only one arm 30, one contact 34 and one free end 32. The other side of such an interconnection is hard attached or laminated to the module with no arm and no compliancy.

Figure 3:
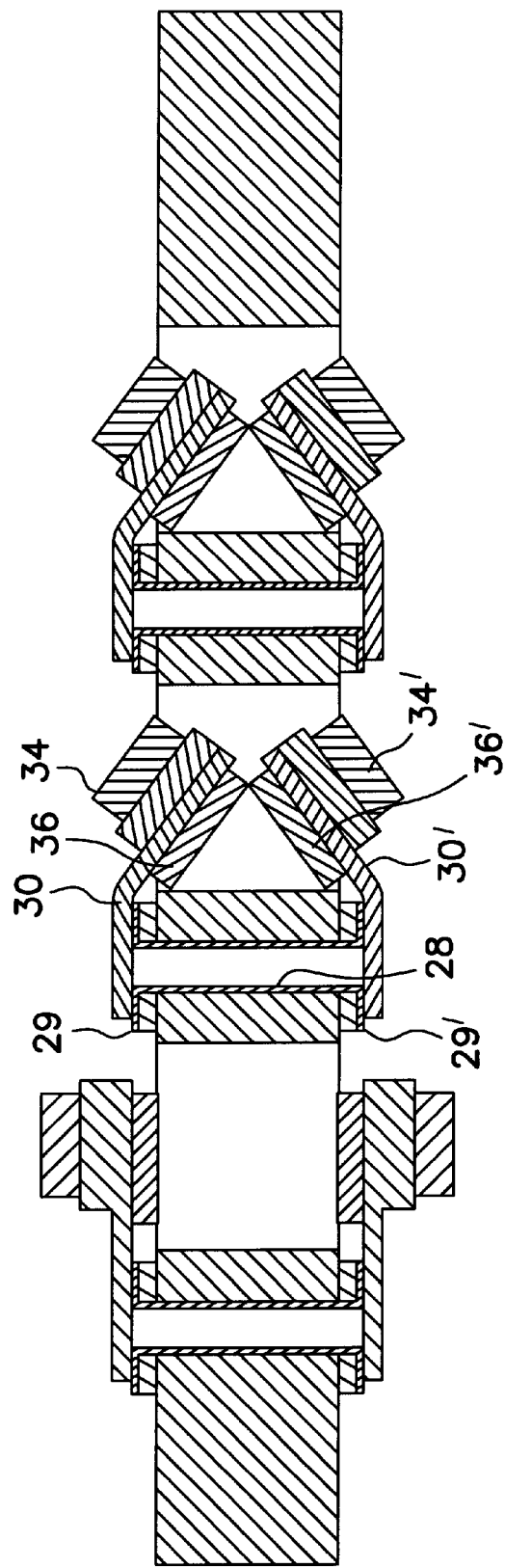
FIG. 3 is a cross section view of the compliant area array interconnect which show some of the I/O sites in an undeflected position and others in a deflected position.

Now referring to FIGS. 2 and 3, each of the interconnect sites 26 includes a mechanically compliant structure which also serves as the electrically conductive path. As part of each of the interconnection sites 26, there is a smaller diameter opening 28 which is near each of the clearance openings 24. A smaller diameter opening 28 is lined with a conductor. Commonly, the conductor is copper. The smaller diameter opening 28 is also known in the art as a via which carries electricity from one side of the board to the other. The via terminates on each side of the carrier board 22 with a pad 29 of electrically conductive material. A pad 29 is located on one side of the carrier board 22 and a pad 29' is located on the other side of the carrier board. The arm 30 is electrically, as well as mechanically, attached to the pad 29 so that the free end of the arm 32 extends over the clearance opening 24 in the carrier board 22. The arm 30 is also made of an electrically conductive material as is the electrical contact 34 located on the free end of the arm 32. The electrically conductive path from the pad 42 of the first module 40 to the pad 46 of the second module 44 includes the electrical contact 34 positioned on the free end 32 of the arm 30, the arm 30, pad 29, the smaller diameter opening or via 28, the pad 29', the arm 30', and the electrical contact 34' positioned on the free end 32' of the arm 30'.

The arm 30 is made of an electrically conductive material, such as beryllium copper (BeCu). The arm 30 support structure is attached to the pad 29 on one end and includes the electrical contact 34 on the other end. The support structure can be made from other tough conductive metals such as beryllium nickel or other materials that can serve the dual role of electrical conductor and a cantilevered leaf spring. The arm geometry and arm material as well as the temper placed on the metal are designed so that a certain deflection of the arm 30 will produce a desired, acceptable reaction force which acts through the electrical contact 34 positioned at the free end of the arm 32 to apply a force to the pad of a module, such as pad 42 of module 40. The arm is designed so that it is flexible enough to allow deflection or compliance to adjust for the non-planarities of the mating surfaces but must also be stiff enough to provide the necessary reaction contact force to ensure a low contact resistance through the electrical contact 34.

The force that the arm 30 delivers can be changed by altering the geometry at the portion of the arm that bends when the contact 34 presses against the contact 42 of a module such as 40. By varying the arm 30, the spring force can be altered. Generally making the structure less wide or thinner will lessen the spring force required for a given deflection. Making the arm thicker, the moment of inertia will be made larger and the arm will be stiffer. The arm 30 may also be tempered to alter its yield point to create the desired reaction force at the contact 34. The arm 30 is also designed to flex or bend slightly to accommodate non-planar surfaces of modules such as 40. As mentioned above, the arm 30 can be designed to operate in either the elastic or plastic region during deflection. The interconnect formed and described in FIGS. 1 and 2 allows for 10–12 mils of compliance which is 2 to 6 times the compliance of previous interconnects. Future designs will have more or less compliance.

The surface of the contact 34 that contacts the pad 42 on the module 40 and also the surface of the contact 34' which contacts the pad 46 of the second module 44 may be specially treated to enhance the electrical contact. It should be noted that a surface treatment does not necessarily have to be carried out. The surface of the contact could just be coated with gold, nickel, copper or the like. The treatment selected depends upon the application of the demateable compliant area array interconnect 20. Other surface treatments which may be used are now described. In the first surface treatment, particles are bonded to a copper arm 30 to create the electrical contact 34. The particles are bonded by being encapsulated in nickel which adheres to the copper. The nickel is tough and when the contact 34 contacts another pad such as 42, the protrusions formed by the particles scrape into the pad being contacted. The resulting irregular surface of the contact pad is effective in penetrating oxide or other insulating films on the mating surfaces of the module 40 or 44. The result is a low electrical resistance contact at a low force.

The second surface treatment that may be used to enhance electrical contact is a dendritic contact surface plating. The dendritic contact surface plating results in multiple contact points of many miniature spikes (dendrites). The small dendrite spikes are capable of film penetration of oxide or other insulating films on the mating surface of another module, such as pad 42 of module 40. The result is a low-force contact that creates a stable connection with a low electrical resistance. Typically the treated surface is not moved in an X or Y direction with respect to the mating surface and, therefore, there is little wear on the contact surface of the electrical contact 34 or 34' or of the mating pads, 42 or 46. In addition, since the surface of the contact wears little, the contact can be used for multiple insertions such as in a testing environment.

Now looking at FIGS. 2 and 3, the operation of the demateable, compliant area array interconnect 20 will be discussed. In operation, the compliant area array interconnect 20 or the intermediate board is sandwiched between a first module 40 and a second module 44. First module 40 has pads 42 which correspond in spatial relationship with the pads 46 of the second module 44. For each of the pair of contacts 42 and 46, there is an interconnection site 26 on the carrier board 22. The electrical contacts 34 and 34' also correspond to each of the contacts on the first module 40 and the second module 44. The contacts 34 and 34' are located so that they correspond in their spacing to the contacts 42 and 46 on the modules 40 and 44. It should be noted here that the cross section in FIGS. 2 and 3 shows only three interconnection sites 26. It must be understood that a multiplicity of interconnection sites 26 located in an array of any shape will comprise the entire demateable, compliant area array interconnect 20. FIG. 3 shows two of the interconnection sites 26 in which the arms 30 and 30' of each of the interconnection sites are fully deflected. In other words, the arms are bent to the point where the free ends 32 and 32' of the arms 30 are touching.

Figure 4:
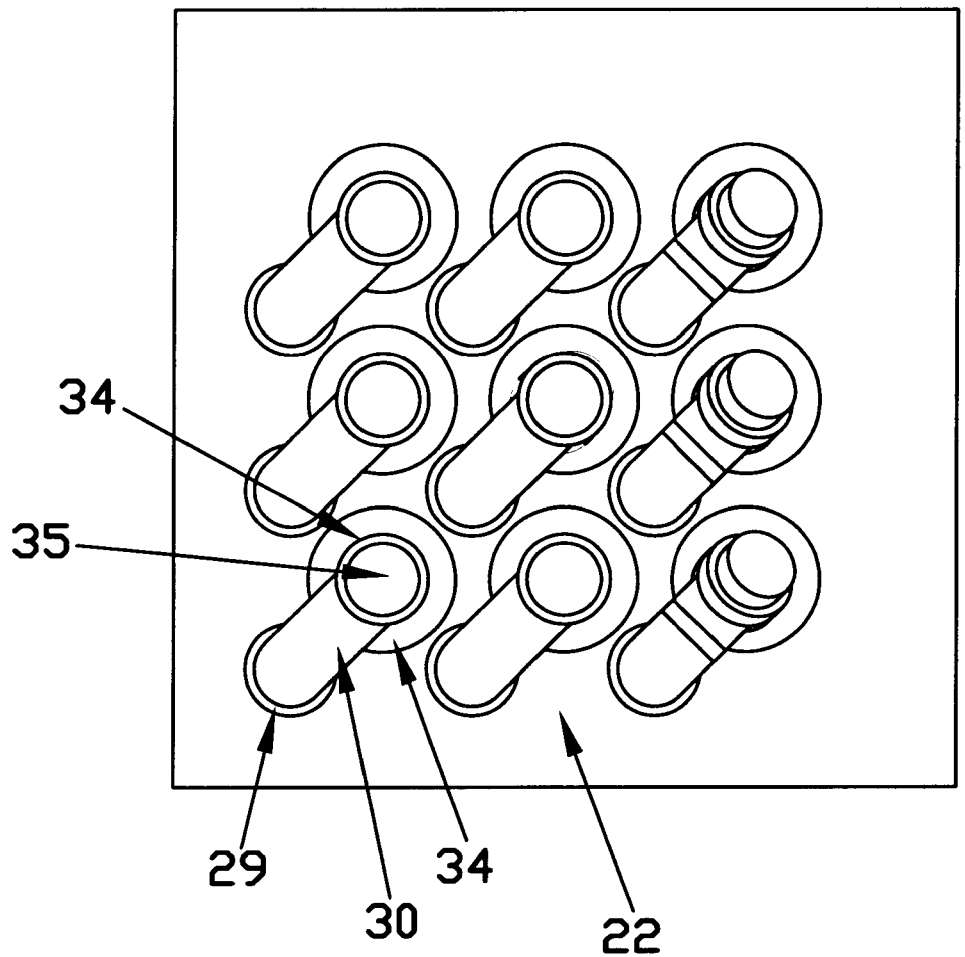
FIG. 4 is a top view of the compliant area array interconnect showing a plurality of the I/O sites.

FIG. 4 shows a top view of a demateable, compliant area array interconnect 20. The arms 30 are connected to the vias 28 (shown in FIG. 2) by way of the pads 29. The electrical contact 34 is cantilevered out from the attachment point over the clearance opening 24 in the substrate 22. The design shows an arm 30 that has a uniform area between the attachment point at the via pad and the electrical contact 34. Of course having such a uniform area is not required. As mentioned earlier, this geometry could be changed in order to produce a spring with a different and desired spring constant. In other words, the arm 30 is not limited to any particular geometric shape. One of the chief advantages of the compliant area array interconnect 20 which is shown in FIGS. 1–4 is that the force necessary to place the interconnect 20 into engagement with a substrate is very low when compared to other interconnect methods such as the woven wire contacts or an elastomeric sheet filled with conductive particles or wires. The force necessary to make the contact between the interconnection sites 26 and the electrical contact on a substrate can be thought of as coming in two parts. The first part is a small amount of force necessary to make electrical contact and the second part of that force is what is required to compress the mechanism which is holding the electrical contact. The mechanism, in this case, arm 30, must be compressed in order to account for non-planarity. For an interconnection device using a plurality of woven wire contacts or an elastomeric sheet, it is not uncommon for a small area containing up to 1600 I/O sites to require up to 300 pounds of force to provide a reliable electrical contact at all sites between the electrical contact on the interconnection board and the substrate to which it is electrically connected.

By contrast, the compliant area array interconnect 20 has very low force requirements. The force at each connection site is in the range of 10–20 grams. To figure out the total force with the compliant area array interconnect 20, one merely multiplies the number of interconnection sites 26 in the particular array interconnect 20 by a constant in the range of 10–20 grams per site to come up with the force. An interconnect with 1600 I/O sites will be discussed as an example. A 1600 I/O interconnect will require 1600 I/O multiplied by 10 grams per I/O which equals 16,000 grams or 16 kilograms of force. One kilogram equals approximately 2.2 pounds of force. Thus, the total amount of force for a 1600 compliant area array interconnect 20 as described herein will be approximately 35.2 pounds which is much less than 300 pounds. Even if the force required is at the top of the range at 20 grams per I/O site, a total force of 70.4 pounds would be required. This is still considerably less than an interconnect with woven wire contacts or one which uses an elastomeric sheet. This translates into a system that can be used in a much more compact way since a smaller mechanical device can be used to apply the necessary force to the compliant area array interconnect 20 to assure good electrical contact.

FIG. 4 also shows the various interconnection sites 26 placed at a pitch of 500 $\mu$m. One of the main advantages of the demateable, compliant area array interconnect is that the pitch or distance between interconnection sites 26 can be very small. In other words, the interconnection sites can be closely spaced to accommodate the closely spaced sites commonly found on multiple chip modules and single chip modules being produced today. This technology is very adaptable to even finer pitches that will be achieved in future designs of multichip modules. Not only can the interconnection sites be placed close together on a very small pitch, but a large area of interconnection sites may be formed. The large area of interconnection sites can be diced into smaller "chips" of interconnect sites. This construction technique results in a lower cost per part when compared to current interconnection systems used by competitors.

Figure 5:
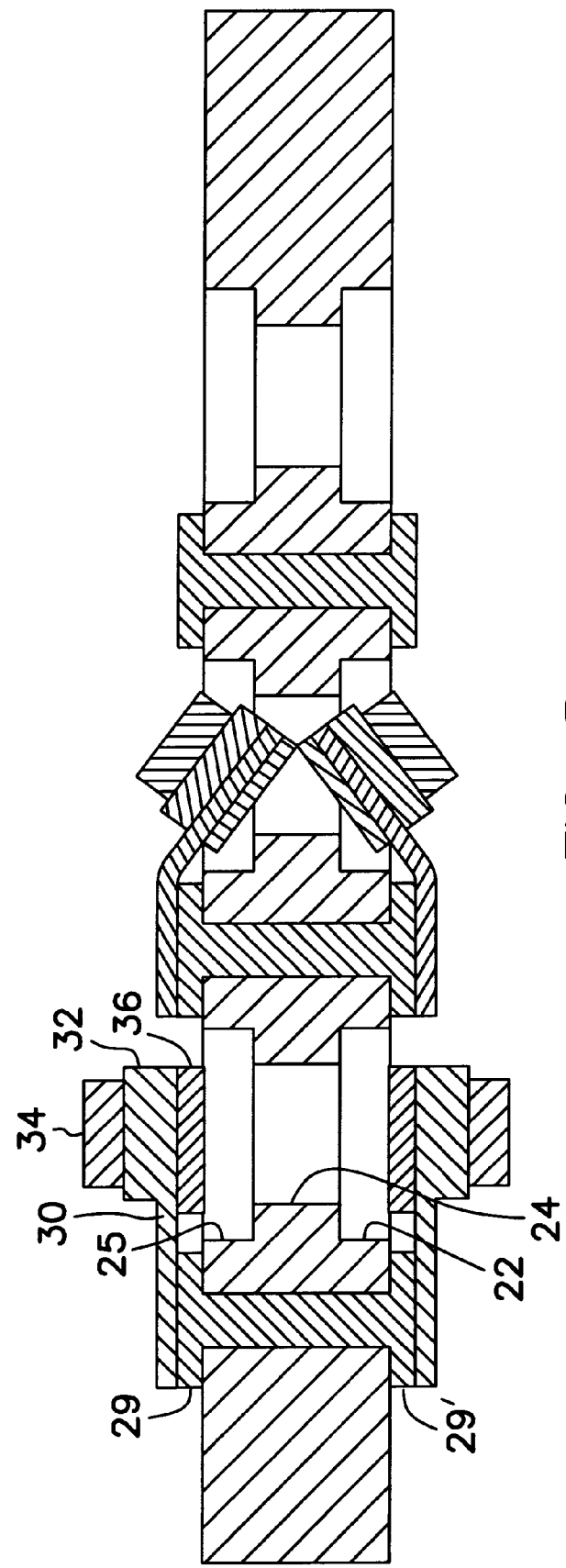
FIG. 5 is a cross section view of another embodiment of the compliant area array interconnect which show some of the I/O sites in an undeflected position and others in a deflected position.

Now turning to FIG. 5, a second embodiment of the demateable, compliant area array interconnect 26 is shown. The demateable, compliant area array interconnect 20 of this second embodiment only differs slightly from the demateable, compliant area array interconnect 20 described previously. As a result, most of the numbers that are used before will be repeated for common elements when describing this particular embodiment. The second embodiment differs in two ways. First of all, rather than having a smaller diameter opening 28 or via which has a plated inside opening, in this particular embodiment the small diameter opening 28 that passes from one side of the carrier board to the other side of the carrier board is filled with a solid, electrically conductive metal. The other main difference is that the clearance opening 24 includes a counter bore 25 located on one side of the carrier board 22 and a corresponding counter bore 25' located on the other side of the carrier board 22. The remaining portions of the second embodiment of the demateable, compliant area array interconnect are the same. The solid via has pads 29 and 29' which occur on one side of the carrier board 22 and on the other side of the carrier board 22, respectively. The arm 30 is attached to the pad 29 and the free end of the arm 32 carries an electrical contact 34. The electrical contact is positioned over the clearance opening in the carrier board and the counter bore in the carrier board.

As shown in the other drawings, one of the interconnection sites 26 is in an undeflected position while a second of the interconnection sites 26 is shown in a fully deflected position where the insulative layers 36 and 36' of the free ends 32 and 32' of the arm touch one another. The surfaces of the electrical contacts can be treated to enhance electrical contact. The treatments include either forming a dendritic contact surface plating which produces multiple contacts of many miniature spikes (dendrites), or the plating particles on the surface using nickel to plate particles to a copper pad or the surface can be plated with gold. The advantage of either of these embodiments is that the demateable, compliant area array interconnect 20 allows for various amounts of deflection at each particular interconnection site 26 to accommodate non-planarities in the paths of a particular chip or substrate. In other words, the demateable, compliant area accommodates a wide range of non-planarities. Another advantage is that the surface treatment on the pads gives the contacts a very low contact resistance, typically less then 25 milliohms. The low contact resistance can be made with a low contact application force, which is typically about 10–20 grams of force per interconnection site 26. The resulting contacts are also electrically capable of handling a high frequency signal that is needed to operate a supercomputer. It is felt that compliant area array interconnects 20 can be built with numerous individual interconnection sites 26 with pitches that are much finer than 500 µm.

Figure 6:
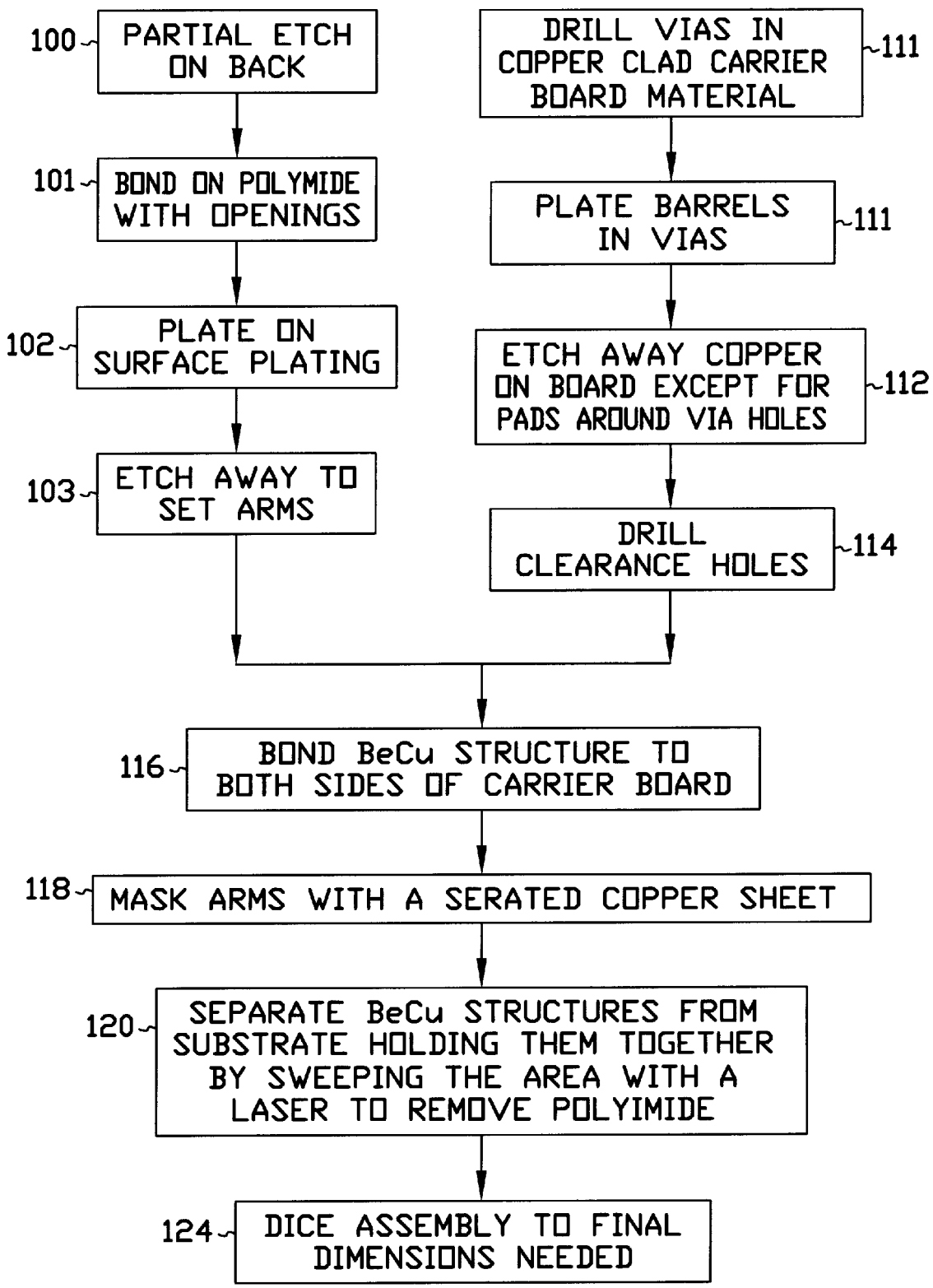
FIG. 6 is a flow diagram showing the steps in fabricating the compliant area array interconnect.

Now turning to FIG. 6, the method for fabricating the demateable compliant area array interconnect 20 will be discussed. It should be noted that the arms can be made of metals other than beryllium copper. For example, the arms could be made of beryllium nickel or other materials that are tough, can act like a spring, and which can conduct electricity. The initial step 100 in fabricating the beryllium copper arms is to partially etch the back of the metal sheet. In this instance, the metal sheet is made of BeCu. A polyimide layer having openings for the carrier board pads is then attached to the back of the partially etched sheet, as depicted by step 101. The openings in the polyimide are placed over the pad portion of the arm bottom which will be attached to the carrier board. Next, the surface plating is placed onto the top side of the BeCu sheet, as depicted by step 102. It is important to do this step while all the arms can be connected to a common ground. This facilitates the plating step. The next step, depicted by step 103, is to etch the top portion of the metal away which leaves a plurality of arms attached to the polyimide sheet. The end result is a series of spaced-apart arms which are held on a polyimide sheet.

The carrier board can be built in a parallel process. Building the carrier board is done by starting out with a copper-clad G10 substrate or other material. Holes are drilled for vias, then the vias are plated. The internal surface of the vias are commonly known as barrels. The copper on the board, except for the pads around the via hole, is then etched away as depicted by step 112. The clearance holes are then drilled in the carrier board as shown by step 114.

The next step 116 is to bond the arms to both sides of the carrier board. The individual arms are bonded or attached by any of a number of techniques including gold thermosonic bonding, soldering, or using conductive epoxy. Using the bonding technique chosen, one end of each arm is attached to a pad on the surface of the carrier board which is at the end of a via. The next step depicted by step 118 in FIG. 6, is to mask the individual arms with a serrated copper sheet. The next step 120 is to remove the polyimide holding the arms together or separate the arm structures by sweeping the area with a laser. Finally, the assembly is diced to the final dimensions needed as indicated by step 124. In the dicing step, much of the edge of the carrier board is removed. The edge that was taken away contains the tooling holes and other markings necessary for positioning various components in the individual fabrication process.

Figure 7:
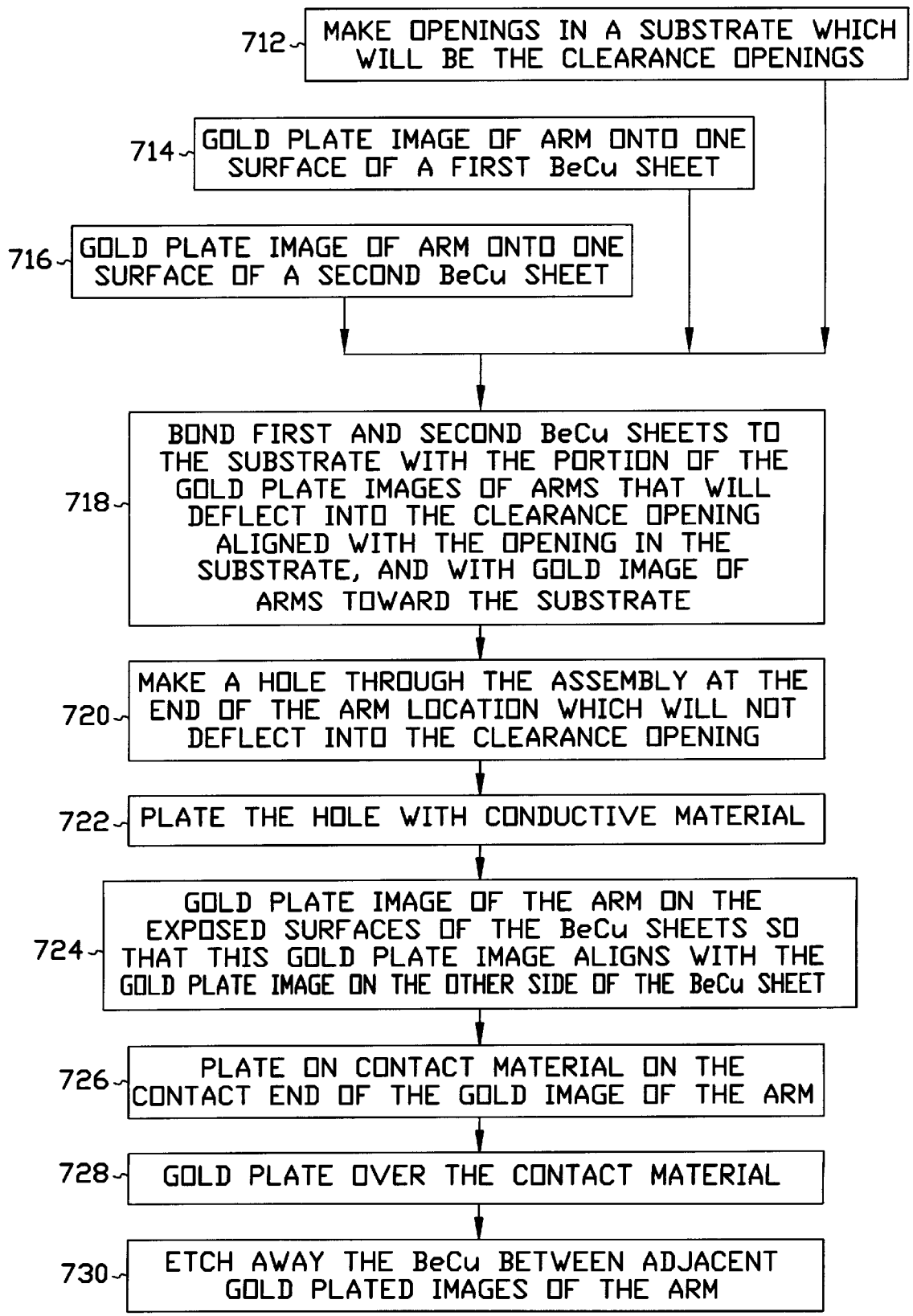
FIG. 7 is a flow diagram showing the steps in fabricating the compliant area array interconnect by another method.
Figure 8:
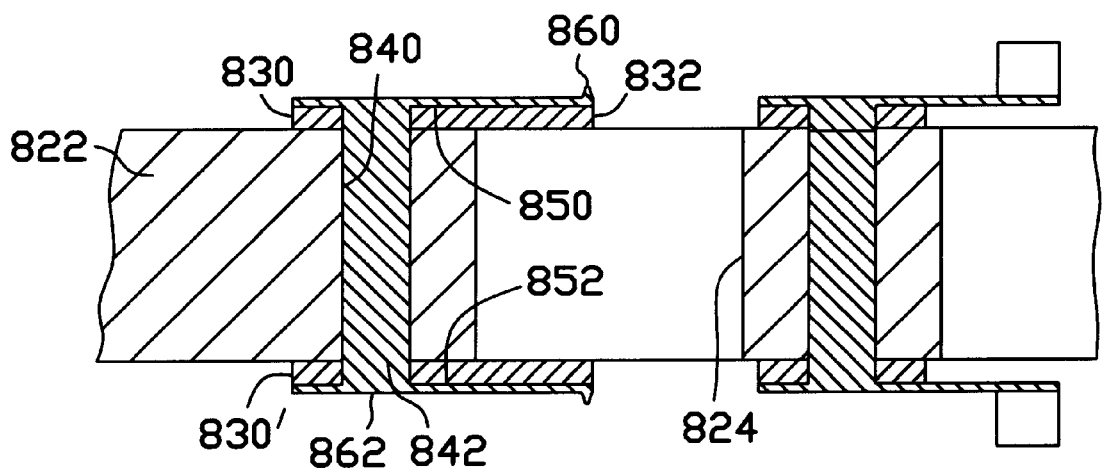
FIG. 8 is a side view of the interconnect formed in FIG. 7.

There are many methods for producing the structure described above. FIG. 6 shows one such method. FIG. 7 shows another method 700 for producing the structure shown in FIG. 8. The structure shown in FIG. 8 is similar to the structures previously discussed. Initially, as depicted by step 712, clearance openings are made in a substrate. Next, as depicted by step 714, an image of the arm is gold plated onto one surface of a first BeCu sheet. As depicted by step 716, this process is repeated on one surface of a second BeCu sheet. These gold plate arms will be the "resist" 10 for future processing. The next step, referenced with the number 718, is to bond first and second BeCu sheets to the substrate with the portion of the gold plate images of arms that will deflect into the clearance opening aligned with the clearance openings in the substrate. The surface of the first and second BeCu sheet containing the gold image of arms are bonded to the substrate. Next, as depicted by step 720, a hole is made through the assembly in the end of the arm location which will not deflect into the clearance opening. As shown in step 722, the hole is plated with conductive material creating a via. The next step, referenced with the number 724, is to gold plate the image of the arm on the exposed surfaces of the BeCu sheets so that this gold plate image aligns with the first gold plate image. This is done on both the first and second BeCu sheet. Next, as depicted by step 726, a surface plating such as dendrites, placing particles onto the pad or merely placing gold, copper, silver, nickel or some other conductive metal on the contact end of the gold image of the arm. Step 728 is to gold plate over the surface plating. The last step shown, having the reference number 730, is to etch away the BeCu between adjacent gold plated images of the arm which are on the BeCu sheet as shown in the side view of FIG. 8.

FIG. 8 shows a side view of the resulting interconnection method 700 depicted in FIG. 7. The result is a carrier board 822 having a clearance opening 824 therein. An arm 830 has an end attached to the carrier board 822 and a free end 832. The free end 832 includes an electrical contact 834. The free end 832 of the arm 830 is cantilevered over the clearance opening 824. A hole 840 is plated to form a solid or non-solid barrel metal contact 842 which connects the top arm 830 and bottom arm 830'. Each of the arms 830 and 830' is made of BeCu or some similar metal contained between two gold images of the arm 830 or 830'.

The gold images of the arm 850 and 852 near or in contact with the carrier board 822 are formed in steps 714 and 716. After bonding first and second BeCu sheets to the carrier board 822 (depicted by step 718), a gold image 860 and a gold image 862 of arm 830 and 830', respectively, are placed on the BeCu or like material sheet. The gold images 850, 860, 852 and 862 act as masks for the etching step 730. The end result is that each arm 830 is BeCu or a like material contained between gold images of the arm. Each arm 830, 830' has a free end positioned over the clearance opening 824.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A device for making electrical connection comprising:
   a carrier board having a clearance opening therein and a first and second surface;
   a first self-supporting, metallic arm attached at one end to said first surface of said carrier board, said first arm having a free end including an electrical contact surface, said first arm attached to said carrier board so that the free end is positioned over said first clearance opening; and
   said carrier board having countersink openings therein near the first and second surface of said carrier board, said countersink openings having a diameter which is larger than a diameter of said first clearance opening.

2. A device for making electrical connections comprising:
   a carrier board having a clearance opening therein and a first and second surface;
   a first self-supporting, metallic arm attached at one end to said first surface of said carrier board, said first arm having a free end including an electrical contact surface, said first arm attached to said carrier board so that the free end is positioned over said first clearance opening;
   a second self-supporting, metallic arm attached at one end to said second surface of said carrier board, said second arm having a free end including an electrical contact surface, said second arm attached to said carrier board so that the free end is positioned over said first clearance opening; and
   a via between the attached ends of the first arm and the second arm.

3. The device for making electrical connections of claim 2 wherein the electrical contact surface of the first and second arm includes a low resistance contact surface.

4. The device for making electrical connections of claim 3 wherein the low resistance contact surface further comprises particles encapsulated with an overcoat material.

5. The device for making electrical connections of claim 3 wherein the low resistance contact surface includes dendritic plating.

6. The device for making electrical connections of claim 2 wherein the first and second arm are made from a material such that said first and second arm act as springs and produce a force at the free end when the free end is moved toward the first clearance opening.

7. The device for making electrical connections of claim 6 wherein the arms are a metal alloy which includes beryllium and copper.

8. The device for making electrical connections of claim 2 wherein the first and second arm may plastically deform when presented with a deflection force.

9. A device for making electrical connections comprising:
   a carrier board having a clearance opening therein and a first and second surface;
   a first self-supporting, metallic arm attached at one end to said first surface of said carrier board, said first arm having a free end including an electrical contact surface, said first arm attached to said carrier board so that the free end is positioned over said clearance opening;
   a second self-supporting, metallic arm attached at one end to said second surface of said carrier board, said second arm having a free end including an electrical contact surface, said second arm attached to said carrier board so that the free end is positioned over said clearance opening; and
   a via between the attached ends of the first arm and the second arm, wherein the carrier board has countersink openings therein near the first and second side of the carrier board, said countersink openings having a diameter which is larger than the diameter of the clearance opening.

10. A device for making electrical connections comprising:
    a carrier board having a clearance opening therein and a first and second surface;
    a first self-supporting, metallic arm attached at one end to said first surface of said carrier board, said first arm having a free end including an electrical contact surface, said first arm attached to said carrier board so that the free end is positioned over said clearance opening;
    a second self-supporting, metallic arm attached at one end to said second surface of said carrier board, said second arm having a free end including an electrical contact surface, said second arm attached to said carrier board so that the free end is positioned over said clearance opening; and
    a via between the attached ends of the first arm and the second arm, wherein the carrier board has counterbored openings therein near the first and second side of the carrier board, said counterbored openings having a diameter which is larger than the diameter of the clearance opening.

11. An interconnection system for providing electrical contact comprising:
    a first substrate having a plurality of electrical contact sites;
    a second substrate having a plurality of electrical contact sites;
    a non-conductive intermediate board for connecting electrical contact sites on the first substrate with electrical contact sites on the second substrate, said non-conductive intermediate board having an interconnection site corresponding to each of the contacts on the first substrate intended to be electrically connected to the contacts on the second substrate, said non-conductive intermediate board having a via associated with each interconnection site and having a non-conductive clearance opening positioned near said via, said non-conductive intermediate board having interconnection sites further comprising:

a first self-supporting, metallic spring arm having a free contact end and an end electrically connected to said via on one side of the non-conductive intermediate board, said contact end positioned over the clearance opening and contacting an electrical contact site on the first substrate; and a second self-supporting, metallic spring arm having a free contact end and an end electrically connected to said via on the other side of the non-conductive intermediate board, said contact end positioned over the non-conductive clearance opening and contacting an electrical contact site on the second substrate.

12. The interconnection system for providing electrical contact of claim 11 wherein the contact end of said first and second arms includes an electrical contact surface having a low resistance contact surface.

13. The interconnection system for providing electrical contact of claim 12 wherein the low resistance contact surface of said first and second arms further comprises:

particles encapsulated in a conductive material placed on said contact end;

a pad of a first soft conductive material; and a second conductive material placed over said particles.

14. The interconnection system for providing electrical contact of claim 11 wherein the contact end of said first and second arms is forced toward or into the non-conductive clearance opening in the non-conductive intermediate board when the assembly placed in contact with the first substrate and the second substrate, respectively.

15. The interconnection system for providing electrical contact of claim 11 further comprising a non-conductive intermediate board having a plurality of interconnection sites for electrically connecting a plurality of electrical contact sites on said first substrate with a plurality of electrical contact sites on said second substrate.

16. The device for making electrical connections of claim 1 wherein the electrical contact surface of the first and second arm includes a low resistance contact surface.

17. The device for making electrical connections of claim 16 wherein the low resistance contact surface further comprises particles encapsulated with an overcoat material.

18. The device for making electrical connections of claim 16 wherein the low resistance contact surface includes dendritic plating.

19. The device for making electrical connections of claim 1 wherein the first and second arm are made from a material such that said first and second arm act as springs and produce a force at the free end when the free end is moved toward the first clearance opening.

20. The device for making electrical connection of claim 19 wherein the arms are a metal alloy which includes beryllium and copper.

21. The device for making electrical connections of claim 1 wherein the first and second arm may plastically deform when presented with a deflection force.

22. An interconnection system for providing electrical contact comprising:

a first substrate having a plurality of electrical contact sites;

a second substrate having a plurality of electrical contact sites;

a non-conductive intermediate board for connecting electrical contact sites on the first substrate with electrical contact sites on the second substrate, said non-conductive intermediate board having an interconnection site corresponding to each of the contacts on the first substrate intended to be electrically connected to the contacts on the second substrate, said non-conductive intermediate board having a via with at least one counterbore associated with each interconnection site and having a non-conductive clearance opening positioned near said via, said non-conductive intermediate board having interconnection sites further comprising:

a first self-supporting, metallic spring arm having a free contact end and an end electrically connected to said via on one side of the non-conductive intermediate board, said contact end positioned over the non-conductive clearance opening and contacting an electrical contact site on the first substrate; and a second self-supporting, metallic spring arm having a free contact end and an end electrically connected to said via on the other side of the non-conductive intermediate board, said contact end positioned over the non-conductive clearance opening and contacting an electrical contact site on the second substrate.

23. The interconnection system for providing electrical contact of claim 22 wherein the contact end of said first and second arms includes an electrical contact surface having a low resistance contact surface.

24. The interconnection system for providing electrical contact of claim 23 wherein the low resistance contact surface of said first and second arms further comprises:

particles encapsulated in a conductive material placed on said contact end;

a pad of a first soft conductive material; and a second conductive material placed over said particles.

25. The interconnection system for providing electrical contact of claim 22 wherein the contact end of said first and second arms is forced toward or into the non-conductive clearance opening in the non-conductive intermediate board when the assembly placed in contact with the first substrate and the second substrate, respectively.

26. The interconnection system for providing electrical contact of claim 22 further comprising a non-conductive intermediate board having a plurality of interconnection sites for electrically connecting a plurality of electrical contact sites on said first substrate with a plurality of electrical contact sites on said second substrate.

* * * * *